(12) United States Patent
Knarr et al.

(10) Patent No.: US 7,498,256 B2
(45) Date of Patent: Mar. 3, 2009

(54) COPPER CONTACT VIA STRUCTURE USING HYBRID BARRIER LAYER

(75) Inventors: Randolph F. Knarr, Putnam Valley, NY (US); Christopher D. Sheraw, Wappingers Falls, NY (US); Andrew H. Simon, Fishkill, NY (US); Anna Topol, Wappingers Falls, NY (US); Yun-Yu Wang, Poughquag, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 11/465,865

(22) Filed: Aug. 21, 2006

(65) Prior Publication Data

US 2008/0042291 A1   Feb. 21, 2008

(51) Int. Cl.
*H01L 21/00* (2006.01)
(52) U.S. Cl. ............... 438/627; 438/619; 438/629
(58) Field of Classification Search .............. 257/763, 257/751; 438/619, 627, 629, 637
See application file for complete search history.

(56) References Cited

U.S. PATENT DOCUMENTS

| | | | | |
|---|---|---|---|---|
| 5,308,796 | A  * | 5/1994  | Feldman et al. | 438/655 |
| 5,955,785 | A  * | 9/1999  | Gardner et al. | 257/751 |
| 6,001,415 | A  * | 12/1999 | Nogami et al. | 216/18 |
| 6,740,392 | B1 * | 5/2004  | Farrar | 428/209 |
| 6,958,291 | B2 * | 10/2005 | Yu et al. | 438/637 |
| 2002/0084192 | A1 * | 7/2002  | Maydan et al. | 205/170 |
| 2004/0209456 | A1 * | 10/2004 | Farrar | 438/627 |
| 2005/0054191 | A1 * | 3/2005  | Yu et al. | 438/629 |
| 2005/0215047 | A1 * | 9/2005  | Daamen et al. | 438/619 |
| 2006/0027932 | A1 * | 2/2006  | Yu et al. | 257/763 |

OTHER PUBLICATIONS

Islam et al., "A 0.20 um CMOS Technology with Copper-filled Contact and Local Interconnect", 2000 Symposium on VLSI Technology Digest of Technical Papers, pp. 22-23, 2000.
Inohara et al., "Copper Filling Contact Process to Realize Low Resistance and Low Cost Production fully compatible to SOC devices", Electron Devices Meeting, 2001. IEDM Technical Digest. International, pp. 4.6.4-4.6.3, 2001.

* cited by examiner

*Primary Examiner*—Laura M Menz
(74) *Attorney, Agent, or Firm*—Yuanmin Cai; Hoffman Warnick LLC

(57) ABSTRACT

Contact via structures using a hybrid barrier layer, are disclosed. One contact via structure includes: an opening through a dielectric to a silicide region; a first layer in the opening in direct contact with the silicide region, wherein the first layer is selected from the group consisting of: titanium (Ti) and tungsten nitride (WN); at least one second layer over the first layer, the at least one second layer selected from the group consisting of: tantalum nitride (TaN), titanium nitride (TiN), tantalum (Ta), ruthenium (Ru), rhodium (Rh), platinum (Pt) and cobalt (Co); a seed layer for copper (Cu); and copper (Cu) filling a remaining portion of the opening.

1 Claim, 1 Drawing Sheet

COPPER CONTACT VIA STRUCTURE USING HYBRID BARRIER LAYER

BACKGROUND OF THE INVENTION

1. Technical Field

The invention relates generally to integrated circuit (IC) chip fabrication, and more particularly, to a copper contact via structure using a hybrid barrier layer.

2. Background Art

In current complementary metal-oxide semiconductor (CMOS) technology, the middle-of-the-line (MOL) contact between a silicide source/drain region of a field effect transistor (FET) and the first back-end-of-line (BEOL) metal layer is made with a tungsten (W) plug using a titanium-titanium nitride (Ti/TiN) barrier layer. MOL indicates a layer of interconnects from a transistor level to other layers that scale the wiring upwardly, which is the BEOL layers. As the size of the MOL contact scales to smaller sizes, such as 65 nm and beyond, the resistance of the tungsten (W) plug becomes a significant limitation of device and circuit performance. To reduce this contact resistance, the tungsten (W) plug must be replaced by a lower resistance material such as copper (Cu). One problem preventing copper (Cu) from being integrated into the MOL contact plug is copper (Cu) proximity to the device and diffusion into the silicon. While physical vapor deposition (PVD) of the TaN/Ta barrier layer processes have been proven as effective diffusion barriers for copper (Cu) in BEOL metal and via levels, they cannot be directly copied into the MOL contact process flow because PVD TaN/Ta films have poor conformality. In addition, the BEOL barrier layer process typically uses a sputter etch to redistribute the material to obtain good sidewall coverage in the vias and little to no coverage at the bottom of the via to facilitate a good copper-to-copper electrical contact. As a result, in the case of a MOL copper contact process, the BEOL process would be insufficient as a diffusion barrier at the bottom of the via because there is no barrier layer created.

SUMMARY OF THE INVENTION

Contact via structures using a hybrid barrier layer, are disclosed. One contact via structure includes: an opening through a dielectric to a silicide region; a first layer in the opening in direct contact with the silicide region, wherein the first layer is selected from the group consisting of: titanium (Ti) and tungsten nitride (WN); at least one second layer over the first layer, the at least one second layer selected from the group consisting of: tantalum nitride (TaN), titanium nitride (TiN), tantalum (Ta), ruthenium (Ru), rhodium (Rh), platinum (Pt) and cobalt (Co); a seed layer for copper (Cu); and copper (Cu) filling a remaining portion of the opening.

A first aspect of the invention provides a contact via structure comprising: an opening through a dielectric to a suicide region; a first layer in the opening in direct contact with the silicide region, wherein the first layer is selected from the group consisting of: titanium (Ti) and tungsten nitride (WN); at least one second layer over the first layer, the at least one second layer selected from the group consisting of: tantalum nitride (TaN), titanium nitride (TiN), tantalum (Ta), ruthenium (Ru), rhodium (Rh), platinum (Pt) and cobalt (Co); a seed layer for copper (Cu); and copper (Cu) filling a remaining portion of the opening.

A second aspect of the invention provides a contact via structure comprising: an opening through a dielectric to a silicide region; a titanium (Ti) layer in direct contact with the silicide region in the opening; a titanium nitride (TiN) layer over the titanium (Ti) layer; a tantalum nitride (TaN) layer over the titanium nitride (TiN) layer; a tantalum (Ta) layer on the tantalum nitride (TiN) layer; a seed layer over the tantalum layer; and copper (Cu) filling a remaining portion of the opening.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
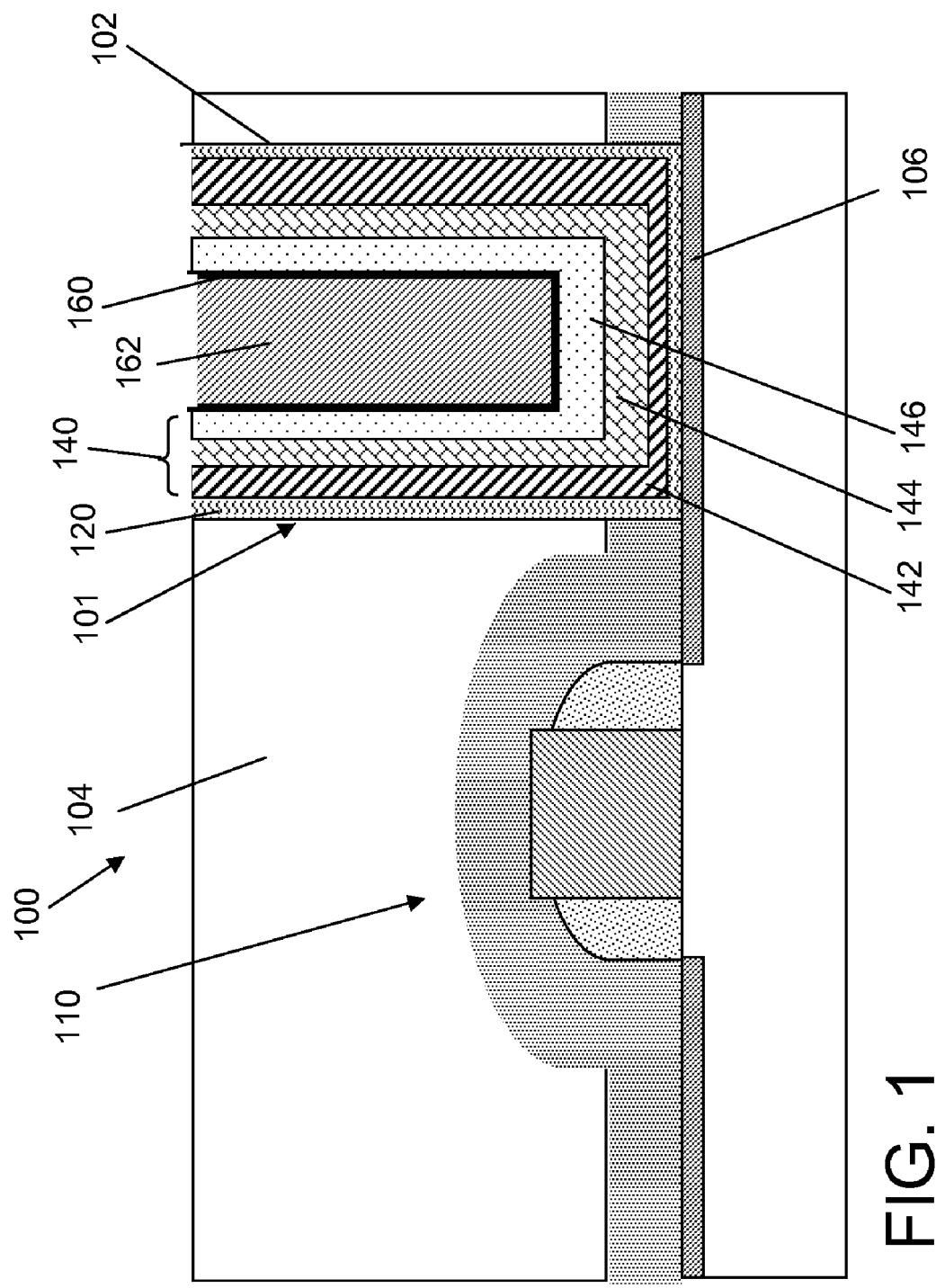
FIG. 1 shows one embodiment of a contact via structure according to the invention.

FIG. 1 shows one embodiment of a contact via structure 100 using a hybrid barrier layer 101 according to the invention. It is understood that while FIG. 1, shows one contact via structure 100, many more can be provided in a single IC chip. In addition, the layers are magnified for clarity of explanation, but are not to scale.

Contact via structure 100 may include an opening 102 through a dielectric 104 to a silicide region 106. As illustrated, contact via structure 100 is adjacent to a semiconductor device 110, e.g., a transistor, and silicide region 106 constitutes a source/drain region thereof. Hence, this illustration shows contact via structure 100 at a middle-of-line (MOL) level of an integrated circuit (IC) chip. Dielectric 104 may include any now known or later developed interlayer dielectric such as silicon nitride ($Si_3N_4$), silicon oxide ($SiO_2$), fluorinated $SiO_2$ (FSG), hydrogenated silicon oxycarbide (SiCOH), porous SiCOH. Silicide region 106 may include any now known or later developed silicide material, e.g., cobalt silicide ($CoSi_x$), tungsten silicide ($WSi_x$), etc. Opening 102 may be formed using conventional single or dual damascene processing.

Contact via structure 100 and, in particular, barrier layer 101 also include a first layer 120 in opening 102 in direct contact with silicide region 106, wherein the first layer is selected from the group consisting of: titanium (Ti) and tungsten nitride (WN).

An at least one second layer 140 is positioned over first layer 120. Although FIG. 1 shows three layers, as will be described herein, at least one second layer 140 may include one, two or three layers. In particular, at least one second layer 140 may include: tantalum nitride (TaN), titanium nitride (TiN), tantalum (Ta), ruthenium (Ru), rhodium (Rh), platinum (Pt) and/or cobalt (Co), depending on the material of first layer 120. In the case that first layer 120 includes titanium (Ti), at least one second layer 140 may include any one of the following embodiments (i.e., layer combinations): titanium nitride (TiN) and tantalum (Ta); titanium nitride (TiN), tantalum nitride (TaN) and tantalum (Ta); titanium nitride (TiN) and platinum (Pt); tantalum (Ta); tantalum nitride (TiN) and tantalum (Ta); tantalum nitride (TaN) and ruthenium (Ru); tantalum nitride (TaN) and rhodium (Rh); tantalum nitride (TaN) and platinum (Pt); ruthenium (Ru); rhodium (Rh); tungsten nitride (WN) and tantalum (Ta); tungsten nitride (WN) and cobalt (Co); tungsten nitride (WN) and platinum (Pt); tungsten nitride (WN) and ruthenium (Ru); tungsten nitride (WN) and rhodium (Rh). In the case that first layer 120 includes tungsten nitride (WN), the at least one second layer may include any one of the following: tantalum (Ta), cobalt (Co), platinum (Pt), ruthenium (Ru) or rhodium (Rh). The particular combination chosen may depend on a number of factors, for example, the technology node, e.g., 32 nm, 45 nm, 60 nm, 90 nm, etc., and the relative space available for the different layers 120, 140.

A seed layer 160 for copper (Cu) may be formed over the last layer of at least one second layer 140. Copper (Cu) 162 fills a remaining portion of opening 102.

One particular embodiment of contact via structure 100 may include opening 102 through dielectric 104 to silicide region 106. In this case, first layer 120 includes a titanium (Ti) layer in direct contact with silicide region 106 in opening 102. At least one second layer 140 may include a titanium nitride (TiN) layer 142 over titanium (Ti) first layer 120, a tantalum nitride (TaN) layer 144 over titanium nitride (TiN) layer 142, and a tantalum (Ta) layer 146 on tantalum nitride (TiN) layer 144. Copper (Cu) 162 fills a remaining portion of opening 102.

Contact via structure 100 provides a low resistance contact from a first metal layer (i.e., above dielectric 104) to silicide region 106 with good copper diffusion barrier and adhesion properties. Barrier layer 101, i.e., first layer 120 and at least one second layer 140 can be deposited by, for example, physical vapor deposition (PVD), chemical vapor deposition (CVD), atomic layer deposition (ALD) or pulsed nucleation layer deposition. In some instances, it may be advantageous to deposit a slightly thicker layer and perform an etch back of a particular layer to redistribute material onto sidewalls of opening 120 to, for example, improve conformality. For example, in one embodiment, the above-described contact via structure 100 may be formed by the following process: First, opening 102 is formed through dielectric 104 to silicide region 106, e.g., by reactive ion etch and a first sputter cleaning. Since a conformal tantalum nitride (TaN) layer 142 is desired on the sidewall and bottom of opening 102, this sputter clean is reduced significantly compared to conventional cleaning processes. First layer 120 in the form of a titanium (Ti) layer may be physical vapor deposited (PVD) in opening 102, followed by forming at least one second layer 140. In this case, at least one second layer 140 may be formed by chemical vapor depositing (CVD) titanium nitride (TiN) layer 142 in opening 102, PVD of tantalum nitride (TaN) layer 144 in opening 102, performing an in-situ etchback of tantalum nitride (TaN) layer 144, redistributing the tantalum nitride (TaN) layer on a sidewall of the opening 102 to ensure good conformality. Next, a second sputter cleaning may be performed without removing tantalum nitride (TaN) layer 144 from a bottom of opening 102. Next, tantalum (Ta) layer 146 may be PVD in opening 102, followed by performing an in-situ etchback of tantalum (Ta) layer 146, redistributing the tantalum (Ta) layer on a sidewall of opening 102 without removing all of the tantalum from the bottom of opening 102. The etch back ensures good coverage (no removal) of the bottom of the via with tantalum nitride (TaN) and tantalum (Ta) and provides a good copper (Cu) adhesion layer. Finally, a seed layer 160 for copper (Cu) may be formed, and copper (Cu) 162 deposited in opening 102. Other processing may also be possible within the scope of the invention.

The structures and/or methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A contact via structure comprising:
   an opening through a dielectric to a silicide region;
   a titanium (Ti) layer in direct contact with the silicide region lining a bottom and sidewalls of the opening;
   a titanium nitride (TiN) layer lining the titanium (Ti) layer within the opening, wherein the titanium nitride (TiN) layer is in direct contact with a bottom and sidewalls of the titanium (Ti) layer;
   a tantalum nitride (TaN) layer lining the titanium nitride (TiN) layer, wherein the tantalum nitride (TaN) layer is in direct contact with a bottom and sidewalls of the titanium nitride (TiN) layer;
   a tantalum (Ta) layer lining the tantalum nitride (TiN) layer, wherein the tantalum (Ta) layer is in direct contact with a bottom and sidewalls of the tantalum nitride (TiN) layer;
   a seed layer over the tantalum Ta layer, wherein the seed layer is in direct contact with a bottom and sidewalls of the tantalum (Ta) layer; and
   copper (Cu) filling a remaining portion of the opening.

* * * * *